(12) United States Patent
Arakawa et al.

(10) Patent No.: US 11,227,658 B2
(45) Date of Patent: Jan. 18, 2022

(54) FLASH MEMORY AND METHOD FOR CONTROLLING THE SAME

(71) Applicant: Winbond Electronics Corp., Taichung (TW)

(72) Inventors: Kenichi Arakawa, Yokohama (JP); Sho Okabe, Yokohama (JP)

(73) Assignee: WINBOND ELECTRONICS CORP., Taichung (TW)

( * ) Notice: Subject to any disclaimer, the term of this patent is extended or adjusted under 35 U.S.C. 154(b) by 0 days.

(21) Appl. No.: 16/903,714

(22) Filed: Jun. 17, 2020

(65) Prior Publication Data

US 2020/0402583 A1  Dec. 24, 2020

(30) Foreign Application Priority Data

Jun. 18, 2019  (JP) .............................. JP2019-112460

(51) Int. Cl.
| G11C 16/04 | (2006.01) |
| G11C 16/10 | (2006.01) |
| G11C 16/26 | (2006.01) |
| G11C 16/34 | (2006.01) |
| G11C 16/14 | (2006.01) |

(52) U.S. Cl.
CPC .......... *G11C 16/10* (2013.01); *G11C 16/0433* (2013.01); *G11C 16/14* (2013.01); *G11C 16/26* (2013.01); *G11C 16/3445* (2013.01)

(58) Field of Classification Search
CPC ..... G11C 16/10; G11C 16/0433; G11C 16/14; G11C 16/26; G11C 16/3445
See application file for complete search history.

(56) References Cited

U.S. PATENT DOCUMENTS

| 8,325,532 B2 * | 12/2012 | Makino .................. G11C 16/30 |
| | | 365/185.18 |
| 9,460,805 B1 | 10/2016 | Pang et al. |
| 10,026,482 B2 * | 7/2018 | Yamauchi ........... G06F 11/1068 |
| 10,276,242 B2 * | 4/2019 | Kimura ............... G11C 11/4097 |
| 10,297,323 B2 * | 5/2019 | Yu ....................... G11C 16/0483 |
| 2010/0074016 A1 | 3/2010 | Higashitani |
| 2018/0358102 A1 | 12/2018 | Zhang et al. |

FOREIGN PATENT DOCUMENTS

| JP | 2008-146771 A | 6/2008 |
| JP | 2014-53565 A | 3/2014 |

OTHER PUBLICATIONS

Japanese Office Action for Japanese Application No. 2019-112460, dated Sep. 9, 2020, with English translation.

* cited by examiner

*Primary Examiner* — Pho M Luu
(74) *Attorney, Agent, or Firm* — Birch, Stewart, Kolasch & Birch, LLP

(57) ABSTRACT

A flash memory having high reliability and a method for controlling the flash memory is provided for seeking stability of memory cell threshold voltage distribution. A NAND string of the flash memory has: a source-line-side select transistor; a source-line-side dummy cell; a plurality of memory cells; a bit-line-side dummy cell; and a bit-line-side select transistor. A method for controlling the flash memory includes the following step: after erasing a selected block, programming the dummy cell of the selected block into a programmed state by applying a programming voltage to a dummy word line which is connected to the dummy cell.

18 Claims, 9 Drawing Sheets

|  | erasing | writing | reading |
|---|---|---|---|
| selected W/L | 0 | 15~20V | 0 |
| unselected W/L | F | 10V | 4.5V |
| SGD | F | Vdd | 4.5V |
| SGS | F | 0 | 4.5V |
| SL | F | Vdd | 0 |
| P-well | 21V | 0 | 0 |

FIG. 7

FLASH MEMORY AND METHOD FOR CONTROLLING THE SAME

CROSS REFERENCE TO RELATED APPLICATIONS

This Application claims priority of Japanese Patent Application No. 2019-112460, filed on Jun. 18, 2019, the entirety of which is incorporated by reference herein.

BACKGROUND OF THE INVENTION

Field of the Invention

The present invention relates to a flash memory and a method for controlling the same, and, in particular, to a flash memory including the dummy cell in the NAND string and a method for controlling the same.

Description of the Related Art

A NAND-type flash memory comprises a memory cell array. The memory cell array comprises a plurality of blocks. Each block forms a plurality of NAND strings. Each string is formed by a plurality of memory cells connected between the bit-line-side select transistor and the source-line-side select transistor. Due to the miniaturization of flash memory, the distance between the bit-line-side/source-line-side select transistor and the memory cell is getting smaller. This can easily cause the drain of the bit-line-side/source-line-side select transistor to generate gate-induced drain leakage (GIDL). It may also cause electrons to be injected into the floating gate of the adjacent memory cell. This in turn causes the threshold of the memory cell to change, or it causes a writing error. In order to minimize such problems, Patent Document 1 (JP2014053565A) discloses a dummy cell that is irrelevant to the data memory configured between the bit-line-side/source-line-side select transistor and the adjacent memory cell.

In a NAND-type flash memory, the amount of memory capacity can be increased by increasing the number of blocks in the memory cell array. However, if the number of blocks is increased, the length of the global bit line that extends in the block-arrangement direction becomes longer, and the speed of operations such as reading becomes slower, due to the increase in load capacitance. Therefore, in order to increase the amount of memory capacity and restrain the load capacitance of the global bit line, the memory cell array is divided into a plurality of numbers, and a certain number of blocks are formed in the divided memory cell arrays.

In a multi-plane flash memory that divides the memory cell array into a plurality of numbers, a plurality of planes are formed in one chip. In one plane, the memory cell array, the column decoding/driving circuit, the row decoder, the page buffer/sensing circuit etc. each has functions to perform. In addition, the controller or the input/output circuit can be shared by a plurality of planes. The controller or the address decoder etc. selects one or more planes among the plurality of planes based on the input row address information, and controls the reading operation, the programming operation, or the erasing operations in the selected plane. For example, the selection of a plane is based on the address that is input externally. The controller selects one plane, or it selects a plurality of planes at the same time.

FIG. 1 shows a schematic view of a flash memory having 2 planes, P0 and P1. Plane P0 and plane P1 each has multiple blocks (n−1, n, n+1), multiple row driving circuit (X_DRVn−1, X_DRVn, X_DRVn+1) for driving the word lines WL0~WL31 of these blocks, and a driving control circuit 10A (or 10B) for driving the bit-line-side/source-line-side select transistors of these blocks.

FIG. 2 shows a schematic diagram of the NAND string and the bit line selecting circuit of the block n. The example here illustrates one even global bit line BLE and one odd global bit line BLO each connected to the NAND string and the bit line selecting circuit 20. Each NAND string is configured by a plurality of transistors. In other words, each NAND string comprises a bit-line-side select transistor SEL_D coupled to the global bit line BLE/BLO, a bit-line-side dummy cell DCD, a source-line-side select transistor SEL_S coupled to the source line SL, a source-line-side dummy cell DCS, and memory cells MC0~MC31 connected between the bit-line-side dummy cell DCD and the source-line-side dummy cell DCS in series.

The bit line selecting circuit 20 comprises a transistor BLSE, a transistor BLSO, a transistor YBLE, and a transistor YBLO. The transistor BLSE is used for selecting the even global bit line BLE. The transistor BLSO is used for selecting the odd global bit line BLO. The transistor YBLE is used for connecting the virtual power VIRPWR to the even global bit line BLE. The transistor YBLO is used for connecting the virtual power VIRPWR to the odd global bit line BLO.

In addition, the driving control circuits 10A and 10B of the planes P0 and P1 respectively output a select signal SGS for driving the source-line-side select transistor SEL_S, and output a select signal SGD for driving the bit-line-side select transistor SEL_D. The driving control circuits 10A and 10B control the voltage levels of the select signals SGS/SGD in response to the operation of the flash memory.

For example, when performing the reading operation, the plane P0 is the selected plane, the plane P1 is the unselected plane, and the block n is selected. The column decoder (not shown) commonly outputs the block select signal BSELn for selecting the block n to the row driving circuits X_DRVn of the planes P0 and P1. Accordingly, the passing transistors of the row driving circuits X_DRVn of the planes P0 and P1 are on. In addition, in order to prevent the driving voltage applied to the word line or the select signals SGS and SGD from dropping due to the passing transistors, the block select signal BSELn will be driven by a very high voltage (for example, higher voltage than that applied to the word line).

In response to the reading command, in the selected plane P0, the driving control circuit 10A provides the select signals SGS and SGD equal to the driving voltage, so as to turn on the bit-line-side select transistor SEL_D and the source-line-side select transistor SEL_S. The row driving circuit X_DRVn applies the ground voltage (GND) to the selected word line, and it applies the reading pass voltage Vpass to the unselected word line, so as to read the data of the selected memory cell of the selected plane P0 via the page buffer/sensing circuit, and then output the read data of the selected memory to the external.

On the other hand, in the unselected plane P1, the transistors are driven by the bias voltages shown in FIG. 3. The passing transistor of the row driving circuit X_DRVn is on. However, because the driving control circuit 10B provides the select signals SGS and SGD equal to the GND level, the bit-line-side select transistor SEL_D and the source-line-side select transistor SEL_S are turned off forcibly, so that the memory cells of the unselected plane P1 are not affected by the operation of the selected plane P0.

Because the driving control circuits 10A and 10B have to output the select signals SGS and SGD with high voltage during the period when the corresponding plane is selected, a high voltage transistor or a level shifter is required to switch to the high voltage bias, thereby increasing the size of the layout. In order to reduce the area, the flash memory shown in FIG. 4 has a driving control circuit 10 shared by two planes P0 and P1 for commonly outputting select signals SGS and SGD that are equal to the driving voltage to the selected plane P0 and the unselected plane P1. Therefore, the bit-line-side select transistor SEL_D and the source-line-side select transistor SEL_S of the unselected plane P1 are both turned on and cannot be turned off forcibly, thereby causing problems with unexpected current flowing into the NAND string of the unselected plane P1, and changing memory cell threshold voltage distribution.

FIG. 5 shows the bias voltages applied to the transistors of the unselected plane P1 during a reading operation. In an initial stage, each transistor of the bit line selecting circuit 20 is off (the gate voltage=GND), and the bit-line-side select transistor SEL_D is off (the select signal SGD=GND), so the global bit lines BLE and BLO of the unselected plane P1 are floating. After the reading operation is started, the driving control circuit 10 first sets the select signal SGD to the H level (for example, VSGD is 4.5V). However, this select signal SGD at the H level will also be provided to the bit-line-side select transistor SEL_D of the unselected plane P1, resulting in the voltage at the global bit lines BLE and BLO of the unselected plane P1 being affected by capacitive coupling with the select signal SGD. For example, the voltage at the global bit lines BLE and BLO of the unselected plane P1 may rise from 0V (default floating state) to 0.5V, or eventually to a higher voltage (depending on the capacitive coupling ratio).

Next, the driving control circuit 10 sets the select signal SGS to the H level (for example, VSGS is 4.5V). This select signal SGS will also be provided to the source-line-side select transistor SEL_S of the unselected plane P1. The dummy cells DCS and DCD are in an erased state (having negative threshold). The GND voltage is applied to the dummy word lines DWLS and DWLD. At this time, if all the memory cells 30 of the NAND string are in a deep erased state (having negative threshold), then the NAND string will generate the cell current Ic. In other words, the current will pass through the bit-line-side select transistor SEL_D and the source-line-side select transistor SEL_S, which are both turned on, and the current will flow from the global bit line BLE/BLO to the source line SL. Even if all the word lines WL are set to the GND voltage, there is no way to avoid such a cell current Ic. Once the cell current Ic flows in the unselected plane P1, the memory cell threshold voltage distribution changes, resulting in low reliability.

BRIEF SUMMARY OF THE INVENTION

To solve this conventional problem, the present invention provides a flash memory having high reliability and a method for controlling the flash memory for seeking stability of memory cell threshold voltage distribution.

A method for controlling a flash memory according to the present invention is provided. The method comprises: receiving a first command to divide a plurality of planes in the flash memory into a selected plane and an unselected plane; programming a dummy cell in a NAND string of the unselected plane, the programmed dummy cell turning off in response to the first command; and providing a select signal to a gate of a select transistor of the selected plane and a gate of a select transistor of the unselected plane commonly according to the first command after the dummy cell is programmed, and turning on the select transistor, to perform operations on the selected plane other than erasing; wherein the dummy cell is arranged between the select transistor and a memory cell.

A flash memory according to the present invention comprises a plurality of memory planes and a controller. Each of the memory planes comprises a plurality of NAND strings. Each of the NAND strings comprises a dummy cell arranged between a select transistor and a memory cell. The controller is configured to apply a programming voltage to a dummy word line of a dummy cell connected to one of the memory planes. The controller is configured to program the dummy cell into a programmed state. The programmed dummy cell turns off in response to a first command. The controller is configured to provide a select signal to gates of the select transistors of the memory planes according to the first command after the dummy cell is programmed, so as to turn the select transistors on to perform operations other than erasing on another one of the memory planes.

According to the present invention, by programming the dummy cell in the NAND string into a programmed state, it is possible to restrain the generation of an unexpected current during out-of-operation and out-of-selection conditions.

BRIEF DESCRIPTION OF THE DRAWINGS

FIG. 7 shows the bias voltages which are applied during the operations of the NAND-type flash memory.

DETAILED DESCRIPTION OF THE INVENTION

Next, the embodiment of the present invention will be described with reference to the drawings. The semiconductor device of the present invention, for example, is a NAND-type flash memory, or a microprocessor, a microcontroller, a logic device, an application specific integrated circuit (ASIC), a video or audio processor, or a wireless signal processor which is embedded with such flash memory.

Figure 6:
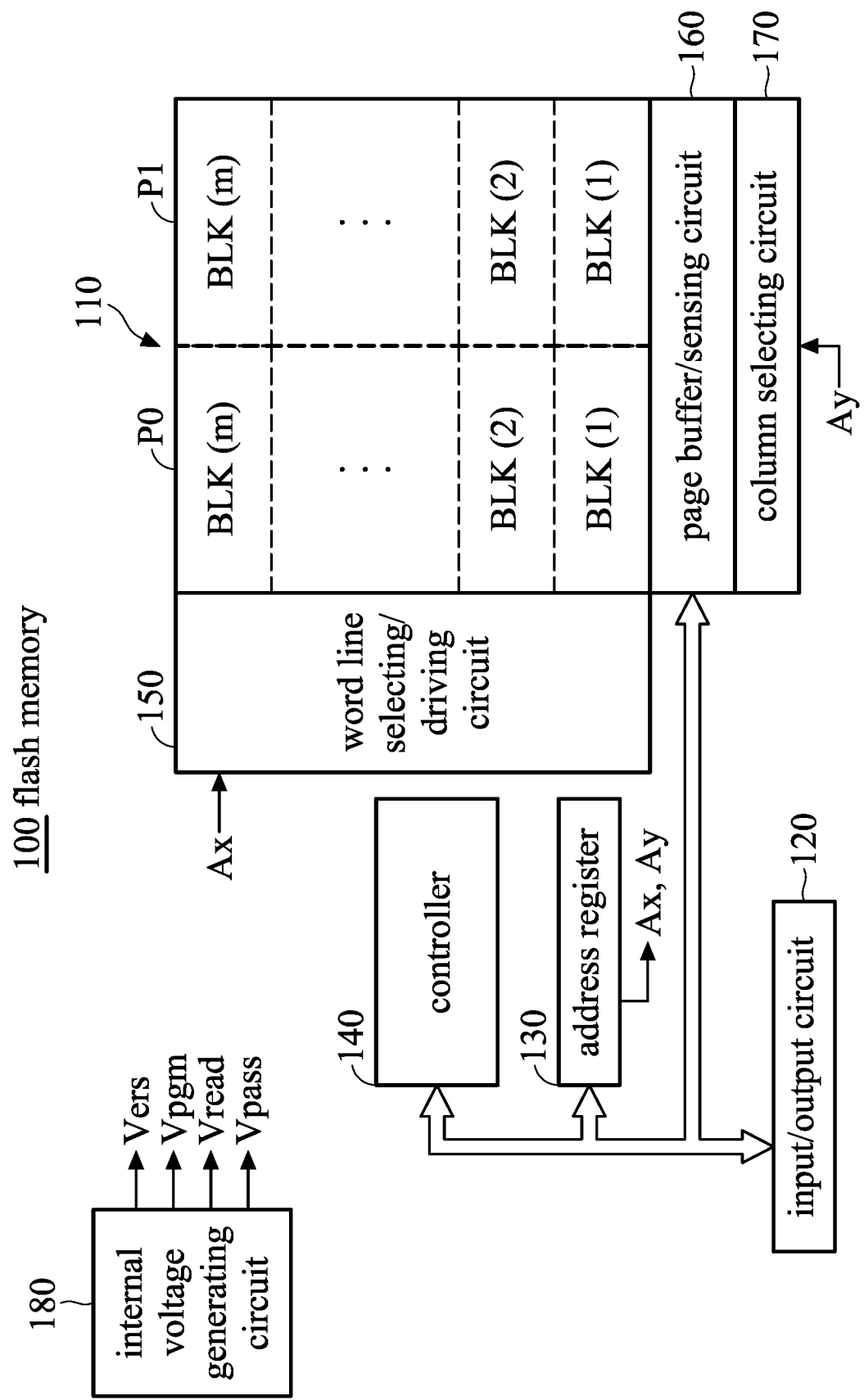
FIG. 6 shows a schematic diagram of the NAND-type flash memory according to the embodiment of the present invention.

FIG. 6 shows a schematic diagram of the multi-plane NAND-type flash memory according to one embodiment of the present invention. The flash memory 100 of this embodiment comprises a memory cell array 110, an input/output circuit 120, an address register 130, a controller 140, a word line selecting/driving circuit 150, a page buffer/sensing circuit 160, a column selecting circuit 170, and an internal voltage generating circuit 180. The memory cell array 110 comprises a plurality of planes P0 and P1. The input/output circuit 120 is connected to an external input/output terminal I/O for inputting or outputting data. The address register 130 receives address data from the input/output circuit 120. The controller 140 controls every part of the flash memory 100 based on the command or the external control signal (for example, the command latch enable signal CLE, or the address latch enable signal ALE and so on) received from the input/output circuit 120. The word line selecting/driving circuit 150 selects the block or drives the word line based on the row address information Ax from the address register 130. The page buffer/sensing circuit 160 keeps the data read from the selected page, and keeps the data to be programmed to the selected page. The column selecting circuit 170 selects the data in the page buffer/sensing circuit 160 based on the column address information Ay from the address register 130. The internal voltage generating circuit 180 generates every kind of essential voltage: for reading, programming, erasing data, etc. (writing voltage Vpgm, reading pass voltage Vpass, erasing voltage Vers, reading voltage Vread, etc.)

Figure 1:
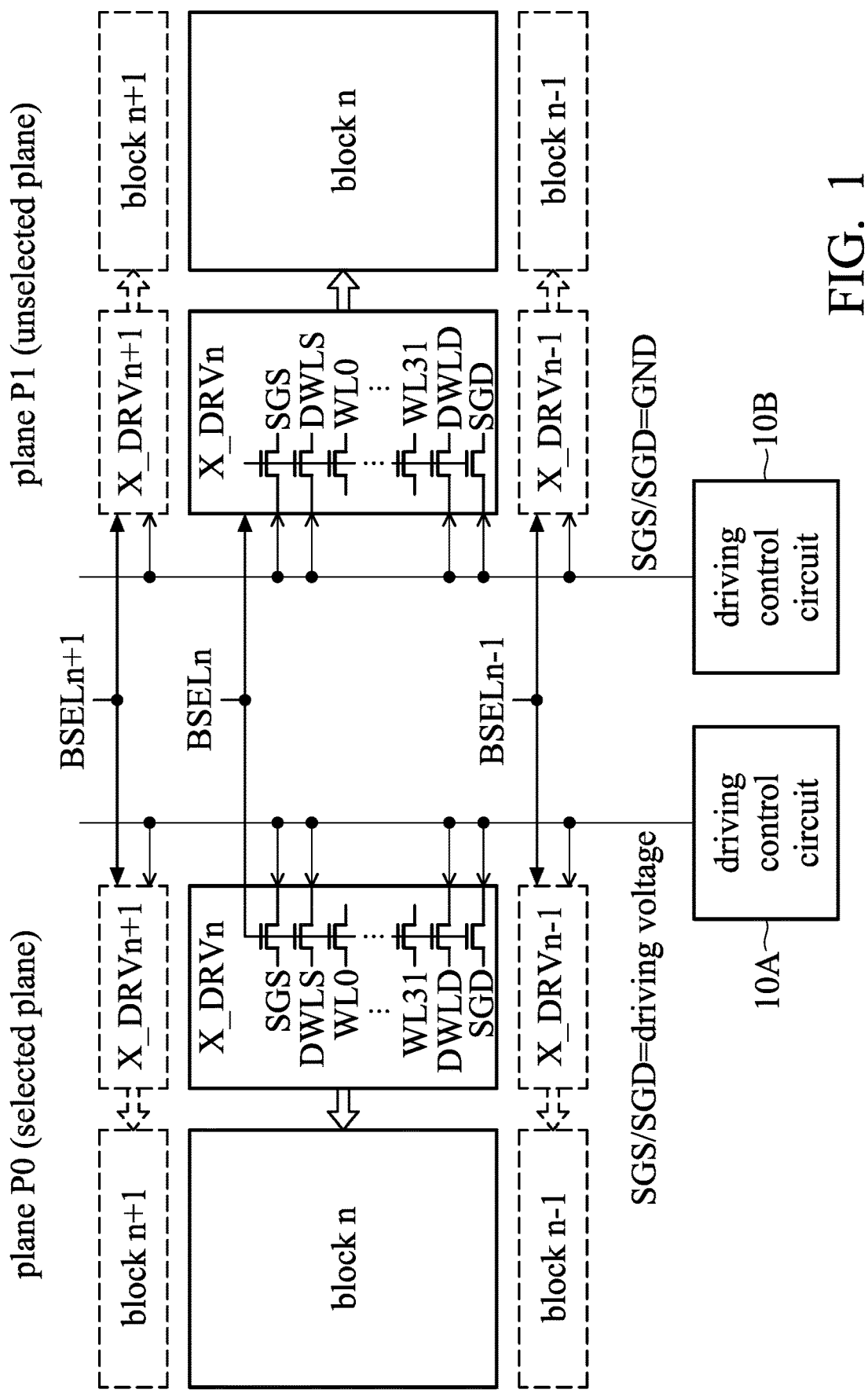
FIG. 1 shows a schematic view of the conventional multi-plane flash memory.
Figure 2:
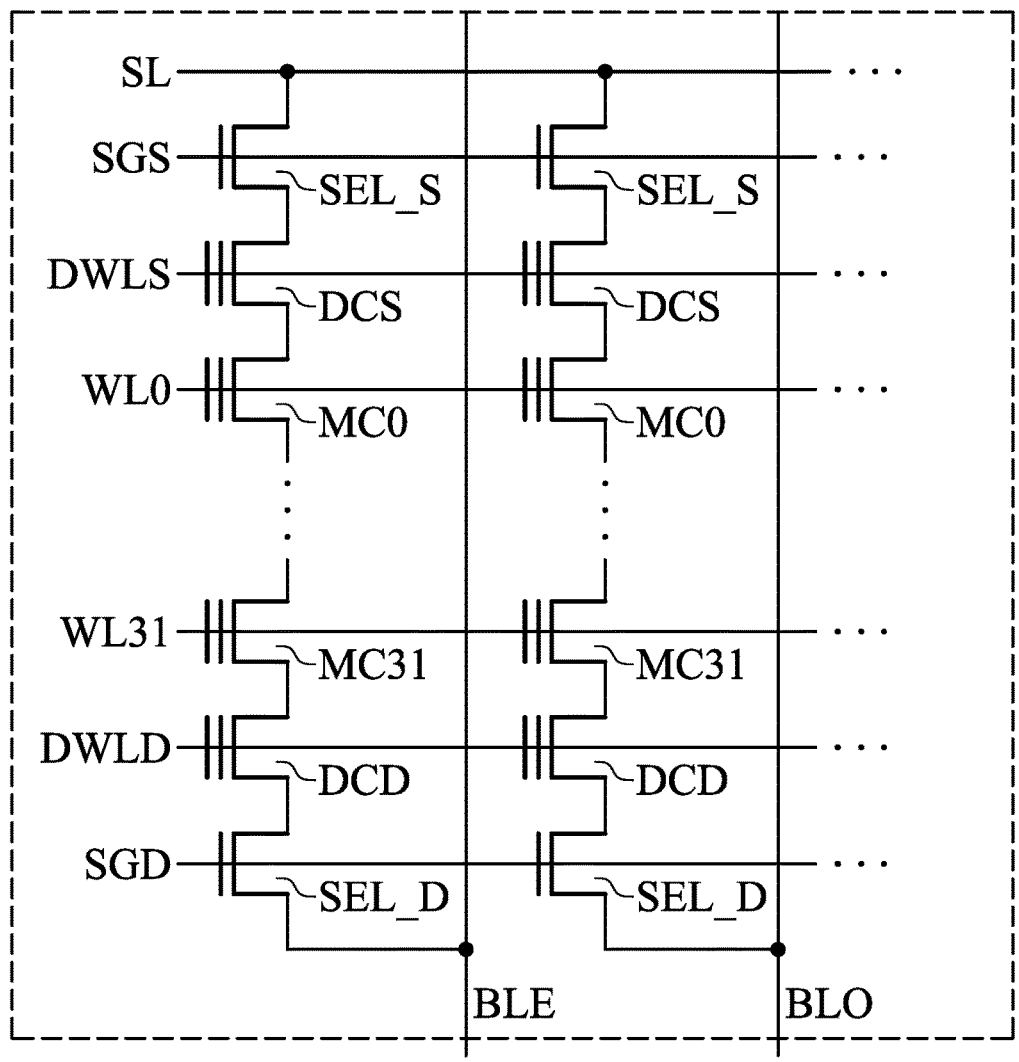
FIG. 2 shows a schematic diagram of the NAND strings of the nth block of the memory cell array, and the bit line selecting circuit which is connected to the NAND strings.
Figure 2:
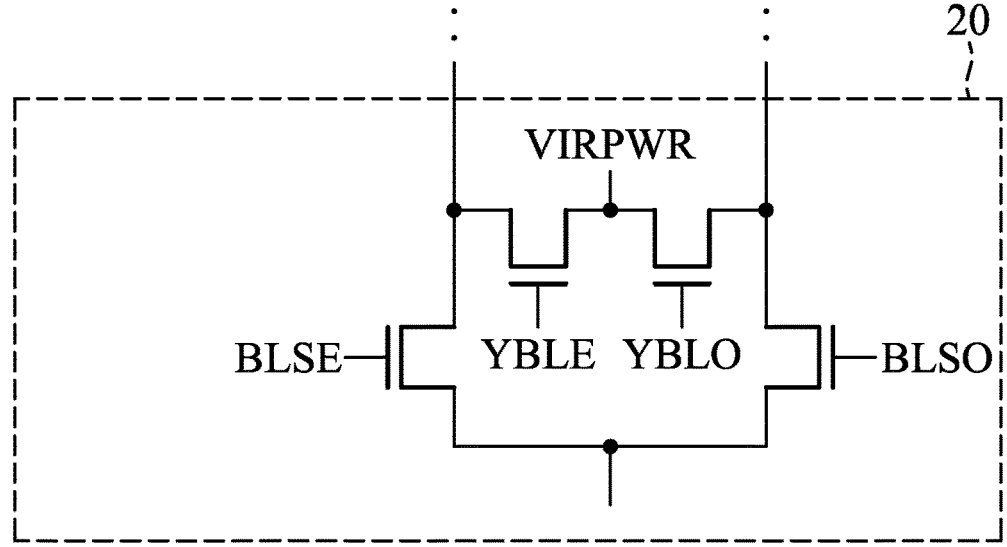
Figure 3:
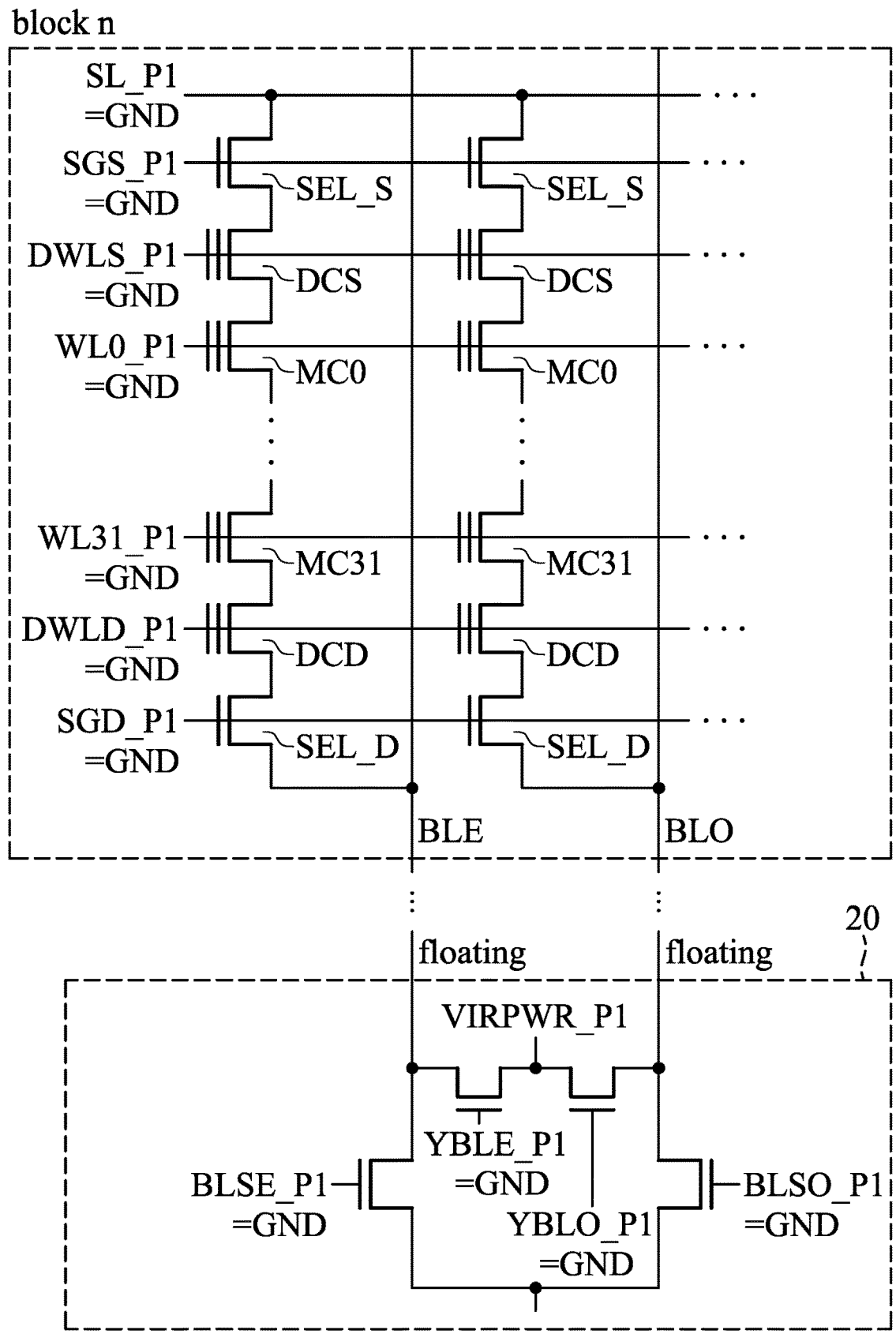
FIG. 3 shows the NAND strings in the unselected plane, and the bias voltages applied to the transistors.

The memory cell array 110 comprises a plurality of planes (for example, planes P0 and P1), and each plane forms m blocks in the column direction. In one block, a plurality of NAND strings are formed in the row direction as shown in FIG. 2. One NAND string comprises a source-line-side select transistor SEL_S; a source-line-side dummy cell DCS; a plurality of memory cells MC0~MC31 connected in series; a drain-line-side dummy cell DCD; and a bit-line-side select transistor SEL_D. The source-line-side select transistor SEL_S is connected to the common source line SL, and the bit-line-side select transistor SEL_D is connected to the corresponding global bit line BLE or BLO.

Figure 4:
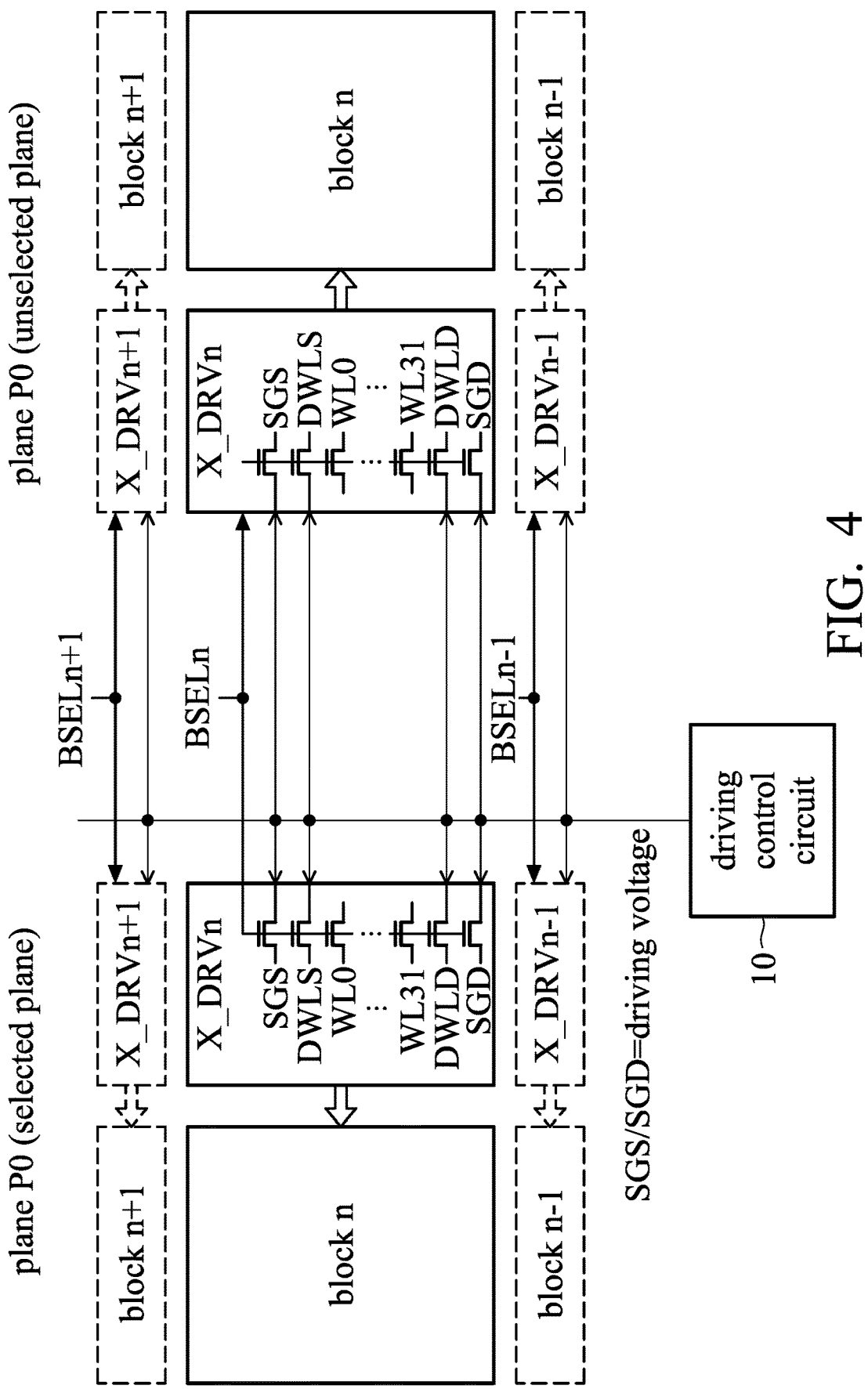
FIG. 4 shows a schematic diagram of the conventional multi-plane flash memory having a driving control circuit shared by multiple planes.

The word lines WL0~WL31 connected to the gates of the memory cells MC0~MC31 respectively, and the dummy word lines DWLS and DWLD connected to the gates of the dummy cells DCS and DCD respectively, are driven by the word line selecting/driving circuit 150. The word line selecting/driving circuit 150 can drive and control the word lines and the dummy word lines of the selected plane or the unselected plane separately. In addition, the select signals SGS and SGD are provided from the driving control circuit 10 (referring to FIG. 4) of the word line selecting/driving circuit 150, to the gates of the source-line-side select transistor SEL_S and the bit-line-side select transistor SEL_D. The driving control circuit 10 is shared by a plurality of planes, in other words, the driving control circuit 10 commonly provides the select signals SGS and SGD to the selected blocks of the selected plane and the unselected plane.

In addition, the NAND strings can be a 2-dimensional array formed on the surface of the substrate, or can be a 3-dimensional array by using the semiconductor layer formed on the surface of the substrate. In addition, one memory cell can be an SLC (Single-level Cell)—type that stores one bit (binary data), or it can be an MLC (Multi-level Cell)—type that stores multiple bits.

The NAND strings of each block of each plane are connected to the global bit lines BLE and BLO via the bit-line-side select transistor SEL_D; and the global bit lines BLE and BLO are connected to the page buffer/sensing circuit 160 via the bit line selecting circuit 20.

FIG. 7 shows the bias voltages which are applied during the operations of the flash memory. In a reading operation, a certain positive voltage is applied to the bit line, a certain reading voltage (for example, 0V) is applied to the selected word line, the reading pass voltage Vpass (for example, 4.5V) is applied to the unselected word line, a positive voltage (for example, 4.5V) is applied to the select signals SGD/SGS for turning on the bit-line-side select transistor SEL_D and the source-line-side select transistor SEL_S, and 0V is applied to the common source line. In a program (write) operation, the programming voltage with high voltage is applied to the selected word line (15~20V), the midpoint potential (for example, 10V) is applied to the unselected word line, turning on the bit-line-side select transistor SEL_D by applying the select signals SGD having the operating voltage Vdd level, and turning off the source-line-side select transistor SEL_S by applying the select signals SGS having the ground voltage level, and providing the potential corresponding to the data "0" or "1" to the bit line. In the erase operation, 0V is applied to the word lines in the block, and a high voltage (for example, 20V) is applied to the P-well to erase the data in block units.

Figure 5:
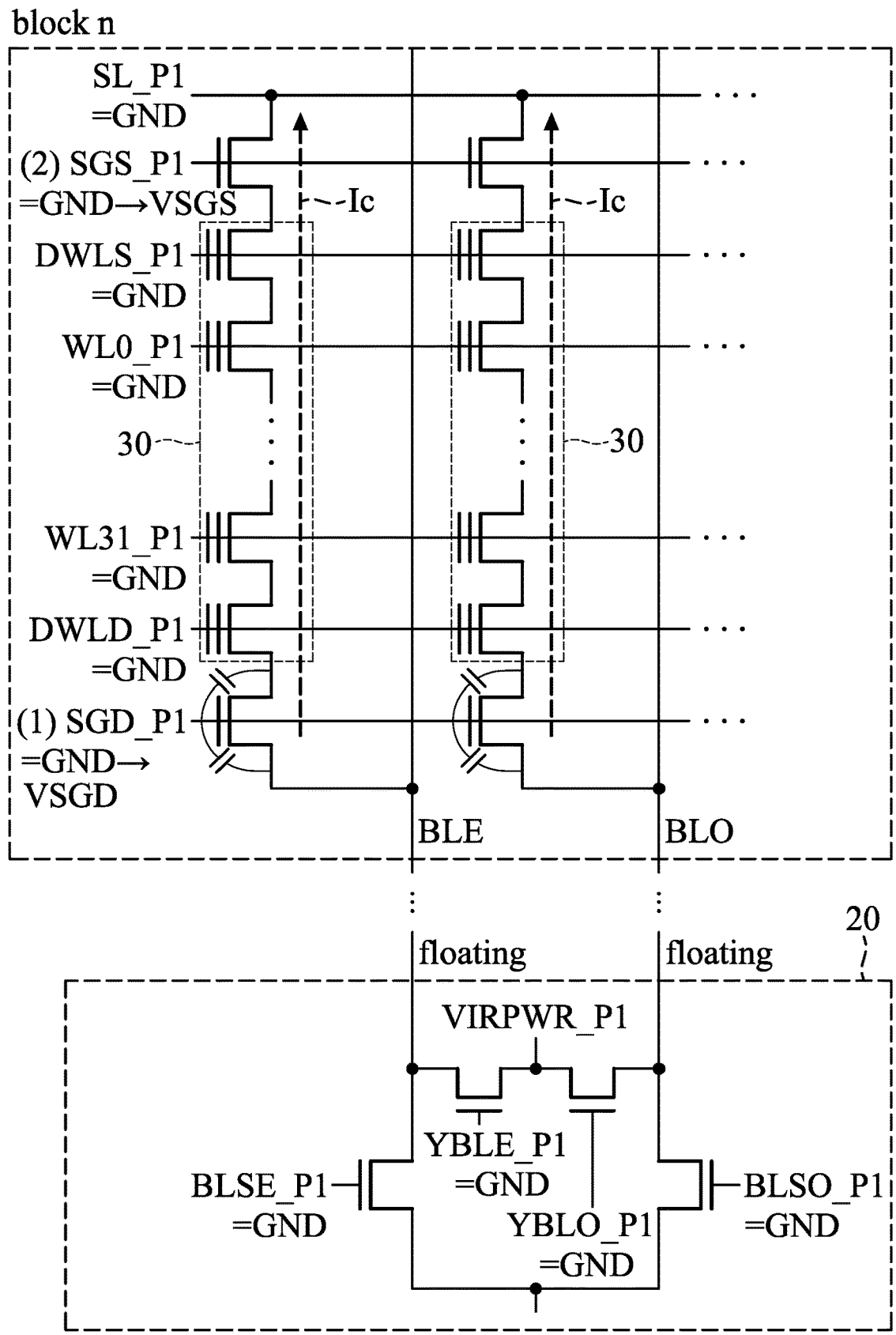
FIG. 5 shows the bias voltages applied to the transistors of the unselected plane of the flash memory shown in FIG. 4 during a reading operation.

For example, the multi-plane type of flash memory 100 can select one of the planes, P0 or P1, based on the input column address information Ay, or it can select both planes P0 and P1 at the same time in response to the command of selecting mode. In the reading operation, programming operation, and erasing operation, the controller 140 can control the selected plane and the unselected plane respectively. The word line selecting/driving circuit 150 outputs the block select signal BSEL in the H level for selecting the block, to the passing transistors of the row driving circuit X_DRV of the selected plane and the unselected plane, thereby turning on the passing transistors. In addition, as described above, the select signals SGS and SGD output from the driving control circuit 10 are driven by the voltage corresponding to the operation of the flash memory (referring to FIG. 7), such driving voltage is provided to the selected block of the unselected plane via the passing transistors which are turned on, and causes the unexpected cell current Ic to flow into the NAND strings of the unselected plane (referring to FIG. 5).

In order to restrain the cell current Ic of the NAND string of the unselected plane, in this embodiment, when performing an operation on the selected plane, the dummy cell of the NAND string in the unselected plane is in a programmed state. In particular, the dummy cell in the NAND string of the unselected plane is programmed before performing operations other than the erasing operation on the selected plane. In the NAND string, the source-line-side dummy cell DCS is connected between the source-line-side select transistor SEL_S and the memory cell MC0, and the dummy cell DCD on the bit line side is connected between the bit-line-side select transistor SEL_D and the memory cell MC31. The dummy cells DCS and DCD are configured to be irrelevant to data storage, and are used to prevent the memory cells MC0 and MC31 adjacent to the source-line-side select transistor SEL_S and the bit-line-side select transistor SEL_D respectively from error programming or threshold shifting due to GIDL. By programming at least one of the dummy cells DCD and DCS, the threshold of the programmed dummy cell can be shifted into positive direction. Accordingly, even if the voltage of the global bit line rises due to capacitive coupling when the select signals SGS and SGD in the H level are applied to the NAND string of the unselected plane, the programmed dummy cell will be turned off due to the GND voltage (0V) applied to the dummy word line, so as to block the cell current Ic which would otherwise pass through the NAND string.

Figure 8:
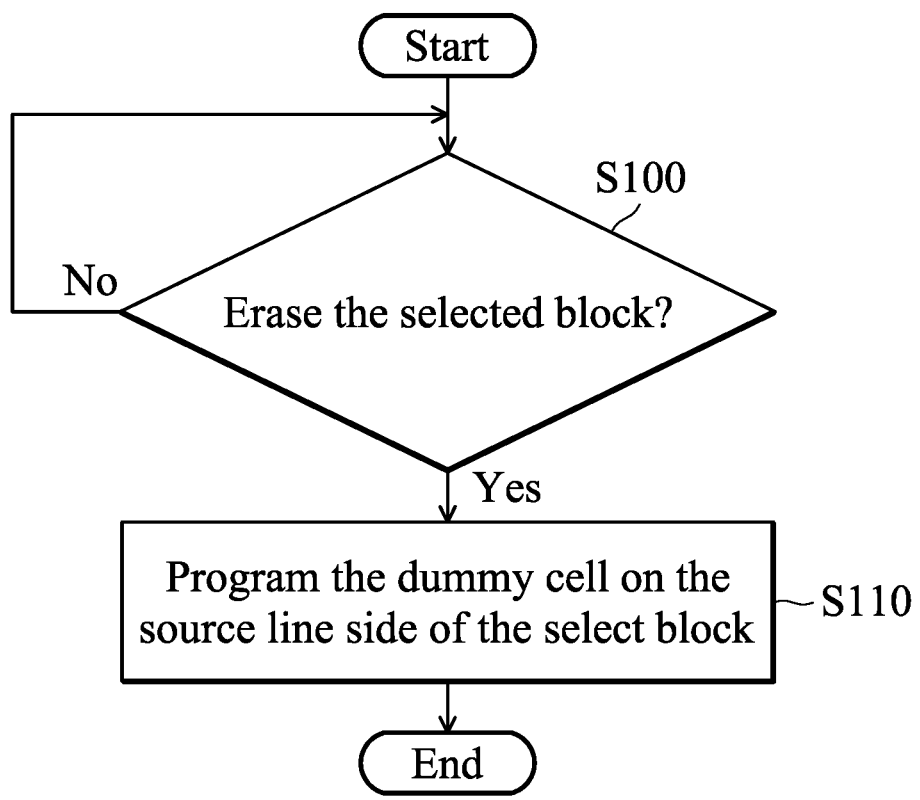
FIG. 8 is a flowchart illustrating the method for controlling the dummy cell according to the embodiment of the present invention.

FIG. 8 is a flowchart of the flash memory of this embodiment to program the dummy cell in response to the erasing command. The controller 140 is configured to erase the selected block of the selected plane in response to the erasing command input from the external, or in response to the internal erasing command for performing a garbage collection function equipped by the controller 140 itself (S100). Then, the controller 140 is configured to program the source-line-side dummy cell DCS of the erased selected block immediately after the erasing verification of the selected block is passed. Specifically, the address of the above dummy cell DCS is stored in a logic register circuit in advance, the dummy word line DWLS connected to the dummy cell DCS can be selected automatically by the word line selecting/driving circuit 150 after the erasing verification of the selected block is passed. The programming (writing) voltage is applied to the dummy word line DWLS according to the bias voltage shown in FIG. 7. However, since the programming of the dummy cell DCS only needs to make the threshold of the dummy cell DCS positive (Vth>0), the programming voltage can be adjusted accordingly. It should be noted that the selected plane in step S100 is different from the selected plane that is read subsequently. For example, the controller 140 is configured to erase the selected block of the plane P1 in response to the erasing command before reading the plane P0, and program the dummy cell DCS on the source line side of the erased selected block immediately after the erasing verification of the selected block of the plane P1 is passed.

In another embodiment, the controller is configured to program the dummy cell of the selected block of the unselected plane in response to a command other than erasing before providing the select signals SGS and SGD. Then, the controller is configured to provide the select signals SGS and SGD to the selected plane and the unselected plane after the dummy cell has been programmed, and thereafter perform operations other than erasing on the selected plane. In detail, the controller is configured to generate a special command in response to the reading command, the special command is used to select and program the dummy cell, wherein the plane of the dummy cell to be programmed is different from the plane to be read. The controller is configured to provide the select signals SGS and SGD to the selected plane and the unselected plane after the dummy cell has been programmed, so as to read data in the selected plane thereafter. In an embodiment, the driving control circuit 10 can be disabled in response to the special command, and can be enabled after the dummy cell has been programmed. In an embodiment, the dummy cells can be selected only when the special command is issued, that is, during the normal operations (such as reading, programming and erasing), the dummy cells are not selected.

Figure 9:
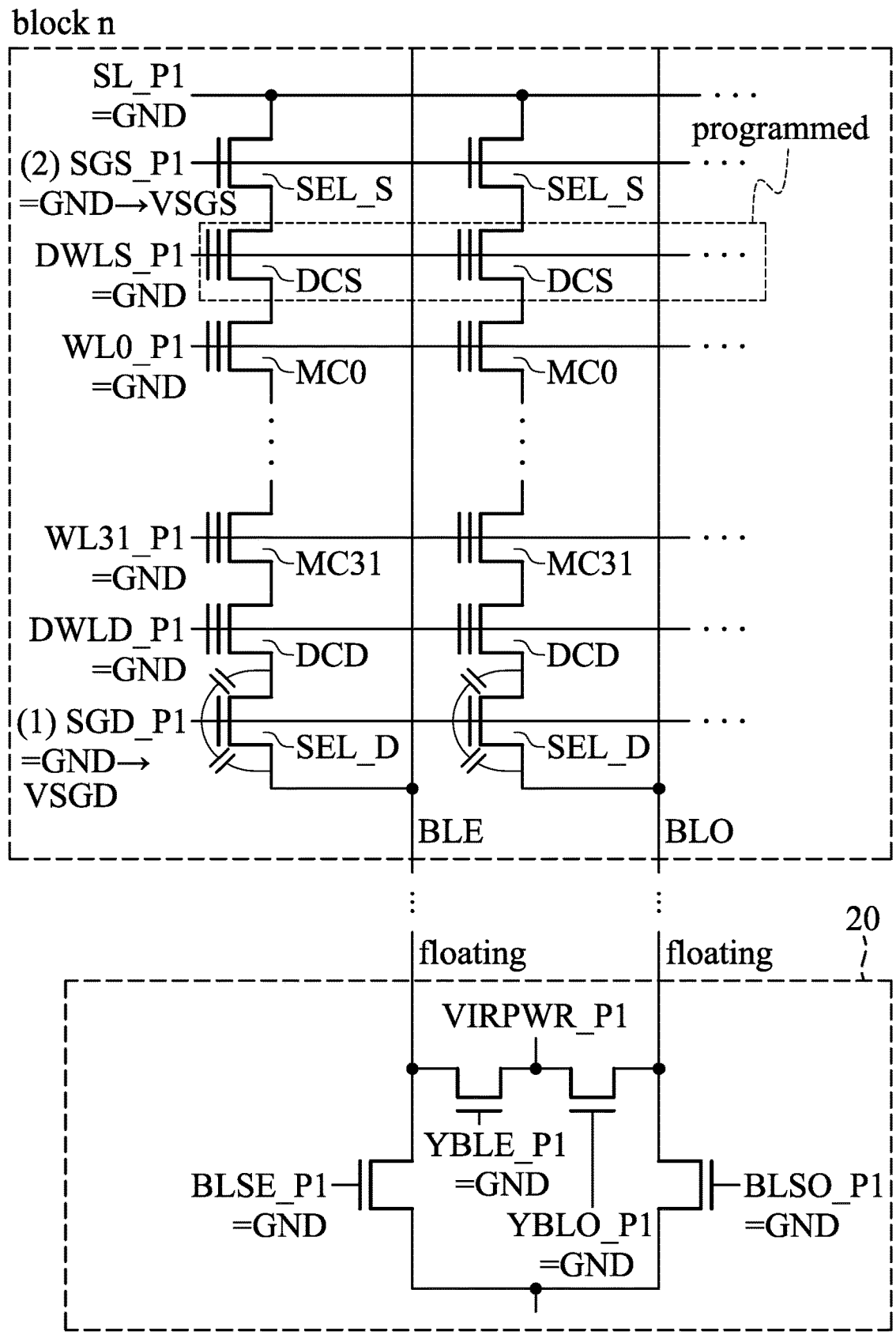
FIG. 9 is an example of programming the dummy cell according to the embodiment of the present invention.

By programming the dummy cell of the unselected plane before providing the select signals SGS and SGD which are equal to the driving voltage to the selected plane and the unselected plane, it can prevent the unwanted cell current Ic flowing into the NAND strings of the unselected plane. FIG. 9 illustrates that when the dummy cell DCS is programmed, the cell current Ic of the NAND string in the unselected plane is restrained. Here, assuming that the plane P0 is the selected plane, the plane P1 is the unselected plane, and the reading of the selected page of the selected block n is performed. In addition, the dummy cell DCS on the source line side of the plane P1 is in programmed state in advanced the reading.

When the reading operation is started, the global bit lines BLE and BLO of the unselected plane P1 becomes floating because the gates of the transistors in the bit line selecting circuit 20 are applied with ground voltage GND. Next, because the bit line of the selected plane is pre-charged, the select signal SGD is driven from the GND level to the H level (VSGD=4.5V). The driving voltage is applied to the gate of the bit-line-side select transistor SEL_D of the unselected plane, thereby the floating voltage on the global bit lines BLE/BLO rises due to being coupled with the gate of the bit-line-side select transistor SEL_D. At this time, in the selected plane, the reading pass voltage Vpass (for example, 4.5V) is applied to the unselected word lines and the dummy word lines DWLD/DWLS; in the unselected plane, the GND voltage is applied to the word lines WL0~WL31 and the dummy word lines DWLD/DWLS. Specifically, in the selected plane, the reading pass voltage Vpass on the dummy word lines is configured to turn on the dummy cells regardless of the dummy cell of the selected plane being programmed or not.

Next, in the selected plane, in order to discharge the bit line which is pre-charged, the select signal SGS is driven from GND level to the H level (VSGS=4.5V). This driving voltage is also be applied to the gate of the source-line-side select transistor SEL_S in the unselected plane, the source-line-side select transistor SEL_S becomes on. However, because the dummy cell DCS is programmed, the threshold of the dummy cell DCS is a positive voltage. Accordingly, the dummy cell DCS of the unselected plane cannot be turned on when the dummy word line of the unselected plane is applied with the GND voltage. Therefore, although the voltage of the global bit lines BLE/BLO rises to 0.5V or the higher, the bit-line-side select transistor SEL_D and the source-line-side select transistor SEL_S are on, no cell current Ic passing through the NAND string will be generated. Therefore, it can prevent the threshold distribution of the memory cells in the unselected plane from changing.

According to the general sequence programming command, the programming operation will start programming from the memory cell on the source line side, and end at the memory cell on the bit line side sequentially. Corresponding to this, only the dummy cell DCS of the source line side is programmed, and thus does not affect the subsequent programming operation.

However, the present invention is not limited to programming the dummy cell on the source line side. In short, as long as the cell current Ic can be blocked, it can be designed to program the dummy cell DCD on the bit line side, or can be designed to program both the dummy cell DCD on the bit line side and the dummy cell DCS on the source line side. In addition, in an embodiment not shown in the drawings, in each NAND string, a plurality of dummy cells can be configured on the source line side, or a plurality of dummy cells can be configured on the bit line side, and the above programming operation to the dummy cell can also to be set to program some or all of their dummy cells.

In the above embodiment, the flash memory having two planes is exemplified; however, the number of planes is not limited to two, and can be greater than or equal to three. For example, when the number of planes is four, it is possible to provide two driving control circuits in the flash memory, wherein one driving control circuit is shared by two planes and the other driving control circuit is shared by another two planes. However, it is also possible to design one driving control circuit shared by four planes.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for controlling a flash memory, comprising:
receiving a first command to divide a plurality of planes in the flash memory into a selected plane and an unselected plane;
programming a dummy cell in a NAND string of the unselected plane, the programmed dummy cell turning off in response to the first command; and
providing a select signal to a gate of a select transistor of the selected plane and a gate of a select transistor of the unselected plane commonly according to the first command after the dummy cell is programmed, and turning on the select transistors, to perform operations on the selected plane other than erasing;
wherein the dummy cell is arranged between the select transistor and a memory cell.

2. The method as claimed in claim 1,
wherein the dummy cell comprises a first dummy cell and a second dummy cell, the select transistor comprises a bit-line-side select transistor and a source-line-side select transistor, the first dummy cell is connected between the bit-line-side select transistor and the memory cell, the second dummy cell is connected between the source-line-side select transistor and the memory cell;
wherein the step of programming the dummy cell only programs the second dummy cell.

3. The method as claimed in claim 1, further comprising:
receiving an erase command before receiving the first command, to erase a selected block of the unselected plane, and verify whether the erasing of the selected block was successful or not;
wherein after verifying that the erasing of the selected block was successful, programming the dummy cell of the erased selected block immediately;
wherein the dummy cell comprises a first dummy cell and a second dummy cell, the select transistor comprises a bit-line-side select transistor and a source-line-side select transistor, the first dummy cell is connected between the bit-line-side select transistor and the memory cell, the second dummy cell is connected between the source-line-side select transistor and the memory cell;
wherein the step of programming the dummy cell comprises: programming at least one of the first dummy cell and the second dummy cell.

4. The method as claimed in claim 3, wherein the step of programming the dummy cell only programs the second dummy cell.

5. The method as claimed in claim 3, further comprising:
storing an address of the dummy cell to a logic register circuit before programming the dummy cell.

6. The method as claimed in claim 3,
wherein the first command is a read command.

7. The method as claimed in claim 1, further comprising:
providing a ground voltage to a dummy word line which is connected to the programmed dummy cell in response to the first command, to turn the programmed dummy cell off.

8. The method as claimed in claim 1,
wherein the step of programming the dummy cell comprises:
generating a special command in response to the first command, the special command being used to select and program the dummy cell;
disabling a driving control circuit in response to the special command before the programming of the dummy cell is completed, the driving control circuit is configured to generate the select signal; and
enabling the driving control circuit after the programming of the dummy cell is completed;
wherein the first command is a reading command reading data from the selected plane after the programming of the dummy cell is completed.

9. A flash memory, comprising:
a plurality of memory planes, wherein each of the memory planes comprises a plurality of NAND strings, and each of the NAND strings comprises a dummy cell which is arranged between a select transistor and a memory cell; and
a controller, configured to:
apply a programming voltage to a dummy word line of a dummy cell which is connected to one of the memory planes, to program the dummy cell into a programmed state, wherein the programmed dummy cell is turned off in response to a first command; and
provide a select signal to gates of the select transistors of the memory planes according to the first command after the dummy cell is programmed, so as to turn on the select transistors, and then to perform operations other than erasing on another one of the memory planes.

10. The flash memory as claimed in claim 9,
wherein each of the NAND strings comprises a first dummy cell and a second dummy cell, the first dummy cell is connected between a bit-line-side select transistor and the memory cell, the second dummy cell is connected between a source-line-side select transistor and the memory cell, and the controller is configured to program only the second dummy cell into the programmed state.

11. The flash memory as claimed in claim 9,
wherein the controller is configured to erase a selected block in one of the memory planes in response to an erasing command, and apply the programming voltage to the dummy word line which is connected to the dummy cell immediately after the selected block is erased, to program the dummy cell into the programmed state;
wherein each of the NAND strings comprises a first dummy cell and a second dummy cell, the first dummy cell is connected between a bit-line-side select transistor and the memory cell, and the second dummy cell is connected between a source-line-side select transistor and the memory cell;
wherein the controller is configured to program at least one of the first dummy cell and the second dummy cell.

12. The flash memory as claimed in claim 11,
wherein the controller is configured to program only the second dummy cell into the programmed state.

13. The flash memory as claimed in claim 11, further comprising:
a logic register circuit, configured to store an address of the dummy cell to be programmed.

14. The flash memory as claimed in claim 9,
wherein the programmed state is a state in which the dummy cell is turned off when a ground voltage is applied to the dummy word line.

15. The flash memory as claimed in claim 9, further comprising:

a word line selecting/driving circuit, configured to select respective blocks of the memory planes based on address information; and a driving control circuit, commonly outputting the select signal which is used to drive a bit-line-side select transistor and a source-line-side select transistor in the NAND strings, to each block of the memory planes selected by the word line selecting/driving circuit.

16. The flash memory as claimed in claim 15, wherein the controller is configured to: select a first plane of the memory planes in response to an erasing command, erase the selected block in the first plane, and apply a programming voltage to the dummy word line of the dummy cell which is connected to the first plane immediately after the selected block is erased, so as to program the dummy cell of the first plane into the programmed state; and the controller is configured to: select a second plane of the memory planes in response to the first command, so as to perform a reading operation on the selected block in the second plane.

17. The flash memory as claimed in claim 15, wherein the controller is configured to read a page of the selected block in the another one of the memory planes selected by the word line selecting/driving circuit in response to the first command;

wherein the word line selecting/driving circuit is configured to:

apply a reading pass voltage to the dummy word line of the dummy cell in the page of the selected block to be read in response to the first command, so as to allow the dummy cell in the page of the selected block to be turned on under any circumstances; and apply a ground voltage to the dummy word line of the programmed dummy cell in response to the first command, to turn off the programmed dummy cell.

18. The flash memory as claimed in claim 15, wherein the controller is configured to:

generate a special command in response to the first command, the special command being used to select and program the dummy cell;

disable the driving control circuit in response to the special command before the programming of the dummy cell is completed; and enable the driving control circuit after the programming of the dummy cell is completed.

* * * * *